United States Patent
Wang et al.

[19]

[11] Patent Number: 5,856,684
[45] Date of Patent: Jan. 5, 1999

[54] HIGH POWER HFET WITH IMPROVED CHANNEL INTERFACES

[75] Inventors: Yang Wang, Chandler, Ariz.; Majid M. Hashemi, Sunnyvale, Calif.; Kurt Eisenbeiser, Tempe; Jenn-Hwa Huang, Gilbert, both of Ariz.

[73] Assignee: Motorola, Inc., Schaumburg, Ill.

[21] Appl. No.: 712,760

[22] Filed: Sep. 12, 1996

[51] Int. Cl.$^6$ .............................................. H01L 31/0328
[52] U.S. Cl. ........................................................ 257/191
[58] Field of Search .................................. 257/191, 192, 257/194, 183

[56] References Cited

U.S. PATENT DOCUMENTS

| | | | |
|---|---|---|---|
| 5,206,527 | 4/1993 | Kuwada | 257/191 |
| 5,331,410 | 7/1994 | Kuwada | 257/191 |
| 5,453,631 | 9/1995 | Onda et al. | 257/192 |

FOREIGN PATENT DOCUMENTS 2 225 899  6/1990  United Kingdom ................... 257/192

*Primary Examiner*—David B. Hardy
*Attorney, Agent, or Firm*—William E. Koch; Eugene A. Parsons

[57] ABSTRACT

A high power heterojunction field effect transistor comprising a first barrier layer including a semiconductor material having a band gap, a second barrier layer including a semiconductor material having a band gap, a channel layer including a semiconductor material having a band gap narrower than the band gaps of the material included in the first barrier layer and the second barrier layer and sandwiched therebetween and an interface layer sandwiched between the channel layer and the first barrier layer.

9 Claims, 2 Drawing Sheets

HIGH POWER HFET WITH IMPROVED CHANNEL INTERFACES

FIELD OF THE INVENTION

The present invention pertains to semiconductor devices and more specifically to heterojunction field effect transistors.

BACKGROUND OF THE INVENTION

To produce a satisfactory heterojunction field effect transistor (HFET) capable of high output power under RF drive, it is necessary for the device to have a high breakdown voltage. Unfortunately, in HFETs having a narrow band gap material channel layer, such as InGaAs alloys, a high breakdown voltage is difficult to achieve, in part due to impact ionization resulting from electrons injected into the channel. Impact ionization is one of the major breakdown mechanisms, and can occur when hot electrons are injected into the channel. During injection, the electron can gain energy from the conduction band edge discontinuity. If the energy exceeds the impact ionization threshold energy, impact ionization may occur in the channel.

Impact ionization can be reduced by using higher band gap material for the channel. This, however, results in a corresponding reduction in efficiency of the device. Other attempts at increasing breakdown voltage include increasing the effective Schottky barrier height for the gate electrode, and reducing peak electric field at the drain edge of the gate.

Power in HFETs is also limited by the maximum current available from the device. One of the mechanisms that limits this current in an HFET is the scattering by the roughness at the heterojunction interfaces. In the channel layer of HFET structures, rough hetero-interfaces are often present due to practical technical constraints. Electrons suffer interface roughness scattering at the bad interface, resulting in lower current.

It would be highly advantageous, therefore, to remedy the foregoing and other deficiencies inherent in the prior art.

Accordingly, it is an object of the present invention to provide a HFET capable of high output power.

Another object of the invention is to provide a new and improved HFET having an increased breakdown voltage threshold.

And another object of the invention is to provide an HFET having reduced impact ionization.

Yet another object of the present invention is to provide an HFET having high current density.

A further object of the present invention is to provide an HFET with reduced interface roughness scattering.

SUMMARY OF THE INVENTION

Briefly, to achieve the desired objects of the instant invention in accordance with a preferred embodiment thereof, provided is a high power heterojunction field effect transistor comprising a first barrier layer including a semiconductor material having a band gap, a second barrier layer including a semiconductor material having a band gap, and a channel layer including a semiconductor material having a band gap narrower than the band gaps of the material included in the first barrier layer and the second barrier layer. The channel layer is sandwiched between the first barrier layer and the second barrier layer. An interface layer is sandwiched between the channel layer and the first barrier layer.

In a specific aspect, the interface layer has a band gap intermediate the band gap of the first barrier layer and the band gap of the channel layer.

In a more specific aspect the interface layer includes a plurality of materials each having a band gap intermediate the band gap of the first barrier layer and the band gap of the channel layer.

In yet another aspect, the interface layer forms a gradient from the band gap of the first barrier layer proximate the first barrier layer to the band gap of the channel layer proximate the channel layer.

In a further embodiment, the high power heterojunction field effect transistor includes a second interface layer sandwiched between the channel layer and the second barrier layer. The second interface layer has a band gap intermediate the band gap of the second barrier layer and the band gap of the channel layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENTS

Figure 1:
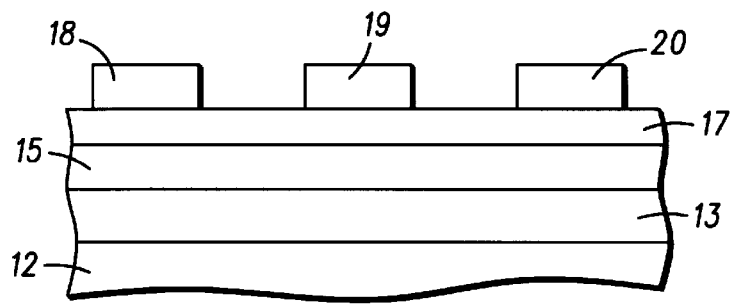
FIG. 1 is a simplified cross sectional view of a channel region of a HFET device.

Turning now to the drawings in which like reference characters indicate corresponding elements throughout the several views, attention is first directed to FIG. 1 which illustrates a conventional heterojunction field effect transistor (HFET) 10. HFET 10 includes a substrate 12, a first barrier layer 13 formed on the surface of substrate 12, a channel layer 15 formed on the first barrier layer 13, and a second barrier layer 17 formed on channel layer 15. Source 18, Gate 19, and drain 20 are formed on second barrier layer 17. Channel layer 15 is formed of a narrow band gap material such as InGaAs while barrier layers 13 and 17 are formed of a much wider band gap materials such as AlGaAs. Further details are not specifically described, as they are well known, and the quantum well region defined by barrier layers 13 and 17 and channel layer 15 is the area of interest to this disclosure.

Figure 2:
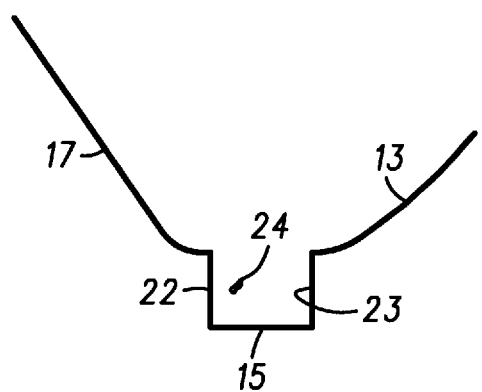
FIG. 2 is a conductance band diagram of the device of FIG. 1.

Turning to FIG. 2, a conduction band diagram of HFET 10 is illustrated, showing the abrupt upper and lower interfaces 22 and 23 between second barrier layer 17 and channel 15, and channel 15 and first barrier layer 13, respectively. A quantum well 24 is defined between interfaces 22 and 23.

In HFET 10 with narrow band gap material channel layer 15, hot electrons injected into the channel gain energy from the conduction band edge discontinuity (abrupt interface 22), resulting in impact ionization which is a major factor in limiting the breakdown voltage. It has been found that when carriers enter a quantum well, impact ionization occurs most likely at interface 22 where the carriers are injected. When an electron is injected into quantum well 24, it gains energy from the conduction band edge discontinuity. Once in quantum well 24, the electron relaxes its energy through phonon scattering or impact ionization if its energy is above the impact ionization threshold energy. Hence, the impact ionization probability of an electron entering the quantum well is highest at the interface at which the electron is injected.

Figure 3:
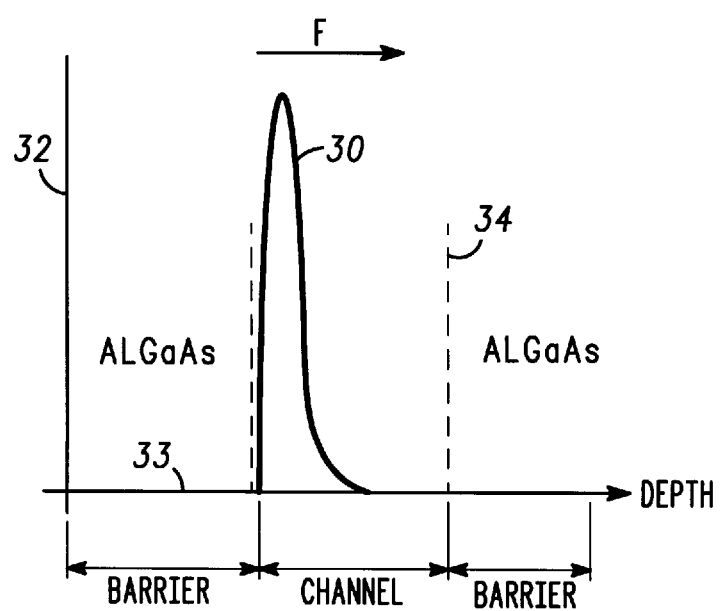
FIG. 3 is a schematic drawing of the impact ionization probability of an injected hot electron in a quantum well of the device of FIG. 1.

Referring to FIG. 3, a curve 30 is illustrated, representing the probability of impact ionization along the distance, with vertical axis 32 and a horizontal axis 33. Broken lines 34 represent the band structure for device 10.

Also, mobility in the channel layer of HFET 10 is one of the crucial parameters for realizing high device performance. Mobility often deviates from a theoretical value due to scattering by roughness in interfaces 22 and 23 above and below channel layer 15, respectively. It has been found that lower interface 23 is worse than upper interface 22 due to technical limitations in the fabrication process.

Figure 4:
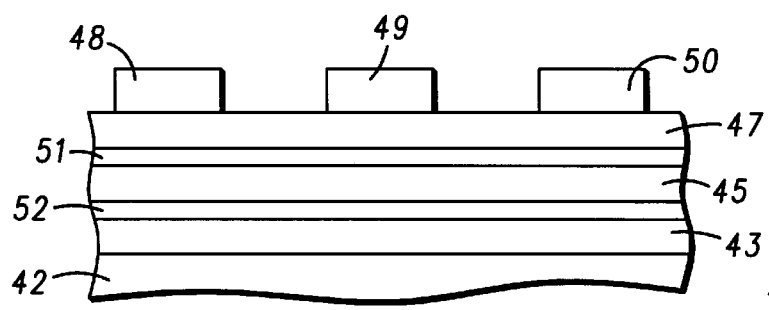
FIG. 4 is a simplified cross sectional view of a channel region of a HFET device according to the present invention.

Turning now to FIG. 4, a heterojunction field effect transistor (HFET) 40 according to the present invention is illustrated. HFET 40 includes a substrate 42, a first barrier layer 43 formed on the surface of substrate 42, a channel layer 45 formed on the first barrier layer 43, and a second barrier layer 47 formed on channel layer 45. Source 48, Gate 49, and drain 50 are formed on second barrier layer 47. Channel layer 45 is formed of a narrow band gap material such as InGaAs while barrier layers 43 and 47 are formed of a much wider band gap materials such as AlGaAs.

Further details are not specifically described, as they are well known, and the quantum well region defined by barrier layers 43 and 47 and channel layer 45 is the area of interest to this disclosure. For purposes of illustration, barrier layers 43 and 47, and channel layer 45 are formed of AlGaAs and InGaAs respectively. One skilled in the art will understand that other wide and narrow band gap materials can be used.

To increase the breakdown voltage of the device, an interface layer 51 is sandwiched between second barrier layer 47 and channel layer 45. Interface layer 51 eliminates the abrupt interface 22 of device 10, increasing the breakdown voltage by reducing impact ionization. Interface layer 51 also reduces interface roughness scattering, thereby increasing mobility. Another interface layer 52 can be sandwiched between channel layer 45 and first barrier layer 43. As the lower interface, roughness scattering is much more likely to occur here. By eliminating the abrupt interface, this scattering is reduced, increasing mobility. It should be noted here that interface layers 51 and 52 may be employed independently or together in a device to achieve the desired characteristics.

Figure 5:
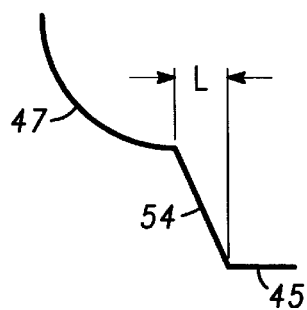
FIG. 5 is a first half of a conduction band diagram of the device of FIG. 4 with a stepped interface.
Figure 6:
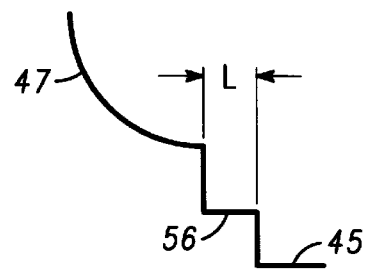
FIG. 6 is a first half of a conduction band diagram of the device of FIG. 4 with a gradient interface.

Turning now to FIGS. 5–8, partial conduction band diagrams are illustrated to show the different interfaces formed by interface layers 51 and 52. In FIGS. 5 and 6, the first half of the conduction band is illustrated with the regions corresponding to barrier layer 47 and channel 45 indicated by like reference numbers. Referring specifically to FIG. 5, a graded interface 54 intermediate barrier layer 47 and channel 45 is shown. In this specific embodiment, graded interface 54 is created by forming interface layer 51 of a material graded between AlGaAs proximate barrier layer 47, through GaAs to InGaAs proximate channel layer 45. In a further embodiment, with reference to FIG. 6, a stepped interface 56 intermediate barrier layer 47 and channel 45 is shown. In this specific embodiment, stepped interface 56 is created by forming interface layer 51 of a material having an intermediate band gap such as GaAs. It should be noted that when a stepped interface is desired, a single step can be employed as described previously or the interface layer can include a plurality of materials each having a band gap intermediate the band gap of the barrier layer and the band gap of the channel layer. In this manner, a series of steps is formed. In each embodiment, an abrupt interface such as abrupt interface 22 of device 10 has been eliminated. The materials used can vary depending upon the material system of the device used.

To insure proper reduction in impact ionization, the thickness of interfaces 54 or 56, denoted as L, should be greater than the mean free path of phonon scattering, so that the carriers lose energy through phonon scattering before entering the channel.

Figure 7:
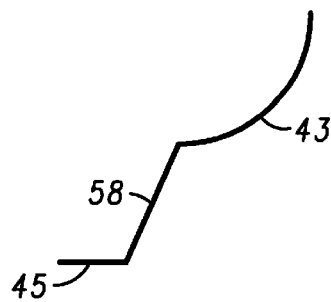
FIG. 7 is a second half of a conduction band diagram of the device of FIG. 4 with a stepped interface.
Figure 8:
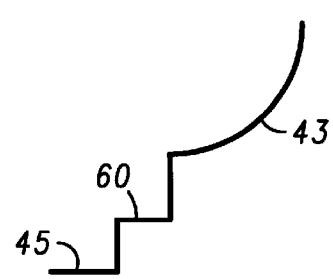
FIG. 8 is a second half of a conduction band diagram of the device of FIG. 4 with a gradient interface.

In FIGS. 7 and 8, the second half of the conduction band is illustrated with the regions corresponding to barrier layer 43 and channel 45 indicated by like reference numbers. Referring specifically to FIG. 7, a graded interface 58 intermediate barrier layer 43 and channel 45 is shown. In this specific embodiment, graded interface 58 is created by forming interface layer 52 of a material graded between AlGaAs proximate barrier layer 43, through GaAs to InGaAs proximate channel layer 45. In a further embodiment, with reference to FIG. 8, a stepped interface 60 intermediate barrier layer 43 and channel 45 is shown. In this specific embodiment, stepped interface 60 is created by forming interface layer 52 of a material having an intermediate band gap such as GaAs. It should be noted that when a stepped interface is desired, a single step can be employed as described previously or the interface layer can include a plurality of materials each having a band gap intermediate the band gap of the barrier layer and the band gap of the channel layer. In this manner, a series of steps is formed. In each embodiment, an abrupt interface such as abrupt interface 23 of device 10 has been eliminated. The materials used can vary depending upon the material system of the device used.

Accordingly, an HFET capable of high output power is disclosed. It will be understood by those in the art that when the term "high power" is used herein the reference is generally to a heterojunction field effect transistor capable of high power, high current, high breakdown, and/or high frequency operation. Further, by providing an HFET with reduced interface roughness scattering, the HFET has reduced impact ionization and high current density.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A high power heterojunction field effect transistor comprising:

a substrate;

a channel layer including InGaAs with a narrow band gap, supported on the substrate;

a barrier layer including AlGaAs having a wider band gap than the narrow band gap of the InGaAs formed adjacent the channel layer; and an interface layer including GaAs sandwiched between the channel layer and the barrier layer, the interface layer having a band gap intermediate the band gap of the barrier layer and the band gap of the channel layer.

2. A high power heterojunction field effect transistor as claimed in claim 1 wherein the interface layer includes a plurality of materials each having a band gap intermediate the band gap of the barrier layer and the band gap of the channel layer.

3. A high power heterojunction field effect transistor as claimed in claim 1 wherein the interface layer forms a gradient from the band gap of the barrier layer proximate the barrier layer to the band gap of the channel layer proximate the channel layer.

4. A high power heterojunction field effect transistor as claimed in claim 1 wherein the barrier layer includes AlGaAs, the channel layer includes InGaAs, and the interface includes a gradient from AlGaAs proximate the barrier layer, through GaAs, to InGaAs proximate the channel layer.

5. A high power heterojunction field effect transistor as claimed in claim 1 further including a second interface layer sandwiched between the channel layer and the substrate.

6. A high power heterojunction field effect transistor as claimed in claim 5 wherein the substrate includes a second barrier layer, adjacent the second interface layer.

7. A high power heterojunction field effect transistor as claimed in claim 6 wherein the second interface layer has a band gap intermediate the band gap of the second barrier layer and the band gap of the channel layer.

8. A high power heterojunction field effect transistor as claimed in claim 7 wherein the second interface layer includes a plurality of materials each having a band gap intermediate the band gap of the second barrier layer and the band gap of the channel layer.

9. A high power heterojunction field effect transistor as claimed in claim 7 wherein the second interface layer forms a gradient from the band gap of the second barrier layer proximate the second barrier layer to the band gap of the channel layer proximate the channel layer.

\* \* \* \* \*